United States Patent
Kerr (10) Patent No.: US 10,649,009 B2
(45) Date of Patent: May 12, 2020

(54) UNGROUNDED CONTROL OF LOW ENERGY ANALOG (LEA) VOLTAGE MEASUREMENTS

(71) Applicant: G & W ELECTRIC COMPANY, Bolingbrook, IL (US)

(72) Inventor: Blair S. Kerr, Orland Park, IL (US)

(73) Assignee: G & W Electric Company, Bolingbrook, IL (US)

( * ) Notice: Subject to any disclaimer, the term of this patent is extended or adjusted under 35 U.S.C. 154(b) by 235 days.

(21) Appl. No.: 15/937,364

(22) Filed: Mar. 27, 2018

(65) Prior Publication Data

US 2019/0302149 A1    Oct. 3, 2019

(51) Int. Cl.
| | | |
|---|---|---|
| *G01R 15/06* | (2006.01) | |
| *H02H 1/00* | (2006.01) | |
| *G01R 31/327* | (2006.01) | |
| *H02H 3/06* | (2006.01) | |

(52) U.S. Cl.
CPC ......... *G01R 15/06* (2013.01); *G01R 31/3272* (2013.01); *H02H 1/0007* (2013.01); *H02H 3/06* (2013.01)

(58) Field of Classification Search
CPC .... H02H 3/06; H02H 1/0007; G01R 31/3272; G01R 15/06; H02B 13/065; H01L 29/66825
USPC .......... 324/637–661, 500, 600, 76.11, 76.26, 324/424–444, 447, 515, 559, 660
See application file for complete search history.

(56) References Cited

U.S. PATENT DOCUMENTS

| | | |
|---|---|---|
| 3,701,944 A | 10/1972 | Amalric |
| 4,763,068 A | 8/1988 | Schmitt et al. |
| 7,126,348 B2 | 10/2006 | Adolfsson et al. |
| 7,459,901 B2 | 12/2008 | Barrault et al. |

(Continued)

FOREIGN PATENT DOCUMENTS

| | | |
|---|---|---|
| WO | 99/42844 A1 | 8/1999 |
| WO | 2008/052495 A1 | 5/2008 |

OTHER PUBLICATIONS

Bleys, "Floating input, optically isloated, highvoltage measurement probe," Review of Scientific Instruments, 1976, 47 (5):621-623.

*Primary Examiner* — Melissa J Koval
*Assistant Examiner* — Trung Nguyen
(74) *Attorney, Agent, or Firm* — Michael Best & Friedrich LLP (57) ABSTRACT

A system and method are provided for a floating reference recloser voltage sensor that measures low energy analog voltage from a voltage divider connected to a high energy transmission line electrode. A floating reference cylindrical voltage screen is coaxially positioned between a high energy transmission line electrode and a cylindrical ground plate, and is positioned closer to the transmission line electrode. The floating reference recloser voltage sensor is filled with a solid dielectric material. A voltage divider network is formed when a voltmeter of a recloser controller is connected to the high-voltage electrode and the floating reference voltage screen, and connected in parallel with another divider network capacitance. The voltmeter reads a low energy voltage drop between the high energy transmission line electrode and the floating reference voltage screen. The recloser controller and the voltmeter are both disconnected from ground.

20 Claims, 4 Drawing Sheets

(56) References Cited

U.S. PATENT DOCUMENTS

| | | | |
|---|---|---|---|
| 8,493,056 | B2 | 7/2013 | Barnett et al. |
| 8,513,939 | B2 | 8/2013 | Hanawa et al. |
| 9,482,699 | B2 | 11/2016 | Hoffman et al. |
| 9,568,512 | B2 | 2/2017 | Divan et al. |
| 2012/0256077 | A1* | 10/2012 | Yen .................. H01L 27/14609 250/208.1 |
| 2012/0261384 | A1 | 10/2012 | LaBianco et al. |
| 2014/0125320 | A1* | 5/2014 | Fong ...................... G01R 1/203 324/126 |
| 2016/0061862 | A1 | 3/2016 | Nulty |
| 2016/0069937 | A1 | 3/2016 | Johnson et al. |

* cited by examiner

410 — Determine and store capacitance values of the high voltage floating reference voltage sensor assembly including:

The capacitance characteristic of the high voltage electrode to the near voltage screen plate (C1 of a voltage divider network),
and
The capacitance characteristic of the voltage screen plate to far a ground plate (C2 of the voltage divider network),
where the voltage screen plate is a floating reference and is not connected to ground.

420 — Connect the voltage screen plate (floating reference) and high voltage electrode to the voltmeter inputs

430 — Read the LEA voltage across the high voltage electrode and the near voltage screen plate of the voltage sensor assembly by the voltmeter

440 — Estimate the AC voltage level of the high voltage electrode to earth ground based on the voltage measured across the high voltage electrode and the near voltage screen plate, and the capacitance values of the high voltage floating reference voltage sensor assembly

FIG. 4

UNGROUNDED CONTROL OF LOW ENERGY ANALOG (LEA) VOLTAGE MEASUREMENTS

FIELD OF THE INVENTION

Embodiments generally relate to methods and systems for determining voltage levels in a high-voltage recloser switch.

BACKGROUND

Reclosers are utilized in power distribution systems at transmission line electrodes to automatically close interrupter switches after they have opened due to a fault. Such interrupters may be used, for example, in utility power-transmission systems or power-distribution systems for railway or industrial plants. A recloser includes a three-phase switch and may employ two voltages sensors per phase leg for monitoring voltage on the input and output transmission lines of the recloser. One voltage sensor monitors the input line to a switch for one phase leg, and another voltage sensor monitors the output line from the switch for the same phase leg. Thus, internal voltage sensors are located on both sides of the interrupter for each phase leg.

A recloser controller may be housed in a frame a distance from a recloser switch. This distance may depend on the amount of electrical insulation needed to isolate the recloser controller relative to the high-voltage recloser switch. The recloser controller receives voltages sensed by the voltage sensors via a control cable. Low energy analog voltage levels may be detected in each sensor utilizing a passive voltage divider circuit, for example, a capacitor network or components that form a capacitor network. The voltage divider circuit may be designed to measure a specified low energy output voltage (Vs) relative to earth ground. This low energy voltage is used to determine a high voltage (HV) level of the transmission line relative to ground. For example, a line input value of HV=10 kilovolts (kV), could ideally yield a sensed output Vs=1 volt (V), for a ratio of HV/Vs=10 k/1.

SUMMARY

Within a recloser voltage sensor, a voltage divider network may be formed by capacitive elements positioned relative to a power line electrode, for example, a voltage screen that encircles the power line electrode, and an earth ground plate encircling the voltage screen. The voltage screen is made of a conductive metal. The interior of the voltage sensor may be filled with a dielectric material. Conductive leads from the voltage screen and the earth ground may be connected to a voltmeter at the recloser controller. A first capacitance may exist between the ground plate and the voltage screen, and a second capacitance may exist between the voltage screen and the power line electrode. In high-voltage systems, the voltage screens are located closer to the ground plates than to the power line electrodes so that low energy analog voltages are output across the screen to ground leads and can be measured by electronics of the voltmeter at the recloser. The recloser controller may determine a drop in voltage from the power line electrode voltage to earth ground based on the sensed voltage screen to earth ground output voltage and the capacitances of the voltage divider network. However, a significant amount of electrical insulation is required in deployment of these systems, and the voltmeter and recloser controller must be located a relatively long distance from the high power transmission lines.

Although the capacitive elements are described, with respect to one example, as cylinders relative to the power line electrode, the capacitive elements are not necessarily cylinders and may have another geometry suitable to form a voltage divider network relative to the power line electrode. For example, the capacitive elements by be formed as partial cylinders, plates, spheres or partial spheres, or other shapes. The capacitive elements are placed near each other with a dielectric material between them. The dimensions and placement of the capacitive elements may depend on the intended power system voltage, dielectric material used, and capabilities of a voltmeter used to measure the voltage. Also, although the screens the capacitive elements are referred to as screen and a ground plate in one example, the capacitive elements may be made of a conductive screen with holes, a solid conductive material, or a combination of screens and solid materials.

Certain embodiments are directed to a recloser floating reference voltage sensor of a recloser controller, where the sensor includes a voltage divider network for measuring low energy analog voltage and the voltage divider network and the recloser controller are disconnected from ground.

In some embodiments, a floating reference recloser voltage sensor system is provided to measure a low energy voltage in a high energy transmission line electrode divider network. The system includes a high energy transmission line electrode, a floating reference voltage screen encircling the high energy transmission line electrode, and a ground plate encircling the floating reference voltage screen and the high energy transmission line electrode. The floating reference voltage screen is positioned between the high energy transmission line electrode and the ground plate at a distance from the high energy transmission line electrode that is shorter than a distance between the ground plate and the floating reference voltage screen. A first conductive lead electrically couples the high energy analog transmission line electrode to a first input of a voltmeter that is connected to a recloser controller. A second conductive lead electrically couples the floating reference voltage screen to a second input of the voltmeter. An alternating voltage drop is measured across the high energy transmission line electrode and the floating reference voltage screen by electronics of the voltmeter connected to the recloser controller. The recloser controller and the voltmeter are both disconnected from the ground plate. Thus, these components are ungrounded or floating.

In some embodiments, a method is provided for measuring low energy voltage in a high energy transmission line electrode sensor network. The method includes encircling a floating reference voltage screen about a high energy analog transmission line electrode, and encircling a ground plate about the floating reference voltage screen and the high energy analog transmission line electrode. The floating reference voltage screen is positioned between the high energy analog transmission line electrode and the ground plate at a distance from the high energy analog transmission line electrode that is shorter than a distance between the ground plate and the floating reference voltage screen. A first conductive lead is electrically coupled to the high energy transmission line electrode and to a first input of a voltmeter that is connected to a recloser controller. A second conductive lead is electrically coupled to the floating reference voltage screen and to a second input of the voltmeter. An alternating voltage drop is measured across the high energy transmission line electrode and the floating reference voltage screen by electronics of the voltmeter connected to the recloser controller. The recloser controller and the voltmeter are both disconnected from the ground plate. In other words, the controller and voltmeter are ungrounded.

In some embodiments, a system is provided for determining high energy transmission line electrode voltages based on a floating reference in a low energy voltage sensor network. The system includes a recloser controller comprising a memory and an electronic processor and a voltmeter electrically coupled to a recloser controller. The voltmeter inputs are electrically coupled to leads of a cylindrical high energy transmission line electrode and a floating reference cylindrical voltage screen encircling the high energy transmission line electrode. The floating reference voltage screen is positioned closer to the high energy transmission line electrode than to a ground plate encircling both the high energy analog transmission line electrode and the floating reference voltage screen. The voltmeter and the recloser controller are disconnected from the ground plate. An analog to digital converter converts low energy voltage measurements of a voltage drop between the high energy transmission line electrode and the floating reference voltage screen for use by the electronic processor. The memory stores capacitance level parameters for a capacitor formed by the high energy transmission line electrode and the floating reference voltage screen and intervening dielectric material, capacitance level parameters for a capacitor formed by the floating reference voltage screen and the ground plate and intervening dielectric material, system capacitance and resistance values for components connected in parallel with the capacitor formed by the high energy analog transmission line electrode and the floating reference voltage screen. Instructions stored in the memory, when executed by the electronic processor, cause the electronic processor to read a voltage level value output from the analog-to-digital converter of the voltage drop between the high energy analog transmission line electrode and the floating reference voltage screen. A voltage level is determined for a voltage drop between the high energy transmission line electrode and the ground plate based on the capacitance level parameters for the capacitor formed by the high energy transmission line electrode and the floating reference voltage screen stored in the memory, the capacitance level parameters for the capacitor formed by the floating reference voltage screen and the ground plate stored in the memory, and the system capacitance and resistance values for the components connected in parallel with the capacitor formed by the high energy transmission line electrode and the floating reference voltage screen.

Other aspects and embodiments will become apparent by consideration of the detailed description and accompanying drawings.

DETAILED DESCRIPTION

Before any embodiments are explained in detail, it is to be understood that the embodiments are not limited in their application to the details of construction and the arrangement of components set forth in the following description or illustrated in the following drawings. Other embodiments are possible and embodiments describe are capable of being practiced or of being carried out in various ways.

It should also be noted that a plurality of hardware and software based devices, as well as a plurality of different structural components, may be used to implement various embodiments. In addition, it should be understood that embodiments may include hardware, software, and electronic components or modules that, for purposes of discussion, may be illustrated and described as if the majority of the components were implemented solely in hardware. However, one of ordinary skill in the art, and based on a reading of this detailed description, would recognize that, in at least one embodiment, the electronic based aspects may be implemented in software (e.g., stored on non-transitory computer-readable medium) executable by one or more processors. As such, it should be noted that a plurality of hardware and software based devices, as well as a plurality of different structural components may be utilized to implement various embodiments. Furthermore, and as described in subsequent paragraphs, the specific configurations illustrated in the drawings are intended to exemplify embodiments and that other alternative configurations are possible. For example, "controllers" described in the specification can include standard processing components, such as one or more processors, one or more computer-readable medium modules, one or more input/output interfaces, and various connections (e.g., a system bus) connecting the components. In some instances, the controllers described in the specification may be implemented in one of or a combination of a general processor, an application specific integrated circuit (ASIC), a digital signal processor (DSP), a field programmable gate array (FPGA), or the like.

The present disclosure provides, among other things, a system and method for determining low energy voltages in a high energy transmission line system using a floating reference voltage divider network. This system may be used with a measurement device in a transmission line recloser voltage sensor system, as a standalone voltage sensor, or as a voltage sensor for any other device in a power system or in another setting. Some embodiments focus on placement of a voltage screen (voltage sensor) and recloser controller (measurement device) in comparison to a power line electrode and its voltage and earth ground.

In some embodiments, the voltage sensor is located physically closer to high-voltage components than the ground components, resulting in a capacitive voltage sensor that is easily measured by a recloser controller device that also has a high-voltage connection and no connection to earth ground. This improvement in a recloser voltage sensor and recloser controller configuration allows for devices to be much more compact and lightweight. These parameters (size and weight) are primarily driven by the required electrical insulation, which is reduced in the present embodiments. The more compact and lightweight design options allow for flexibility in placement and configuration of the recloser controller device. Moreover, cost savings are achieved when the reduction in size and reduced electrical insulation requirements are met by connecting the recloser controller device at the voltage potential of the power system.

Figure 1:
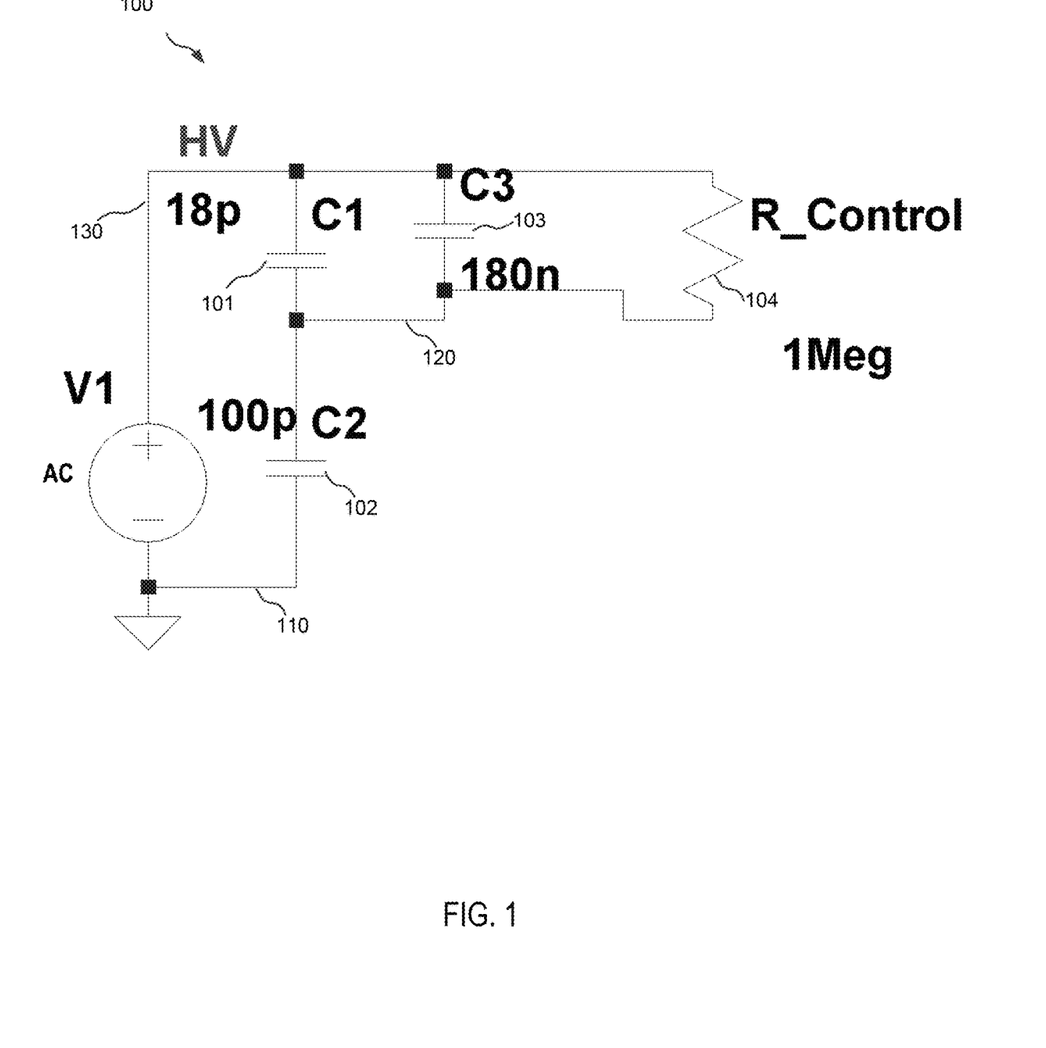
FIG. 1 is a circuit diagram of a floating reference low energy analog (LEA) voltage detector system including a voltage divider network, according to some embodiments.

FIG. 1 is a circuit diagram of a floating reference low energy analog (LEA) voltage detector system including a voltage divider network, according to some embodiments. The circuit diagram in FIG. 1 is a model of components connected to or a part of a recloser and illustrates a voltage sensor system 100. The voltage sensor system 100 includes a ground 110, a high voltage (HV) line electrode 130, a voltage screen electrode 120, a capacitor 101 (C1), a capacitor 102 (C2), a capacitor 103 (C3), and control resistor 104 (R_Control). The capacitor 101 is positioned in series with the capacitor 102 to divide the voltage drop across the HV line electrode 130 and the ground 110 at the voltage screen electrode 120. The capacitor 101 is positioned in parallel with the capacitor 103 and the control resistor 104.

As noted, the voltage divider network shown in FIG. 1 is a model of actual components. In one embodiment, the control resistor 104 represents the resistance within a voltmeter that is used to measure the voltage drop across the HV line electrode 130 and the voltage screen electrode 120. Although the control resistor 104 is shown in the example illustrated in 104, in other example, an impedance component or impedance components other than or in addition to a resistor could be used, for example, a capacitor and/or an inductor. The capacitor 103 represents the capacitance of passive components connected in parallel with the capacitor 101 and the control resistor 104. For example, capacitor 103 represents capacitance in an electrical junction that connects the HV line electrode 130 and the voltage screen electrode 120 to the voltmeter inputs. The ground 110 may be electrically coupled to earth ground.

The voltage sensor system 100 is a voltage divider network that is designed such that a low energy analog (LEA) voltage is measured across the HV line electrode 130 and the voltage screen electrode 120. The voltage drop from the HV line electrode 130 to the voltage screen electrode 120 is much smaller than the voltage drop between the voltage screen electrode 120 and the ground 110. In this regard, the voltage screen electrode 120 may be referred to as a floating reference as it is utilized as a reference for a LEA voltmeter measurement relative to the HV line electrode 130, and it is not connected to the ground 110. Furthermore, the voltage sensor system 100 may be referred to as the floating reference voltage sensor system 100. The voltmeter leads are attached to the HV line electrode 130 and the voltage screen electrode 120, and the measured voltage may be orders of magnitude smaller than the voltage drop between the HV line electrode 130 and the ground 110. However, embodiments are not limited to a specific relative voltage difference between the voltmeter measured voltage and the voltage drop between the HV line electrode 130 and the ground 110. In some embodiments, the voltage level of the HV line electrode 130 relative to the ground 110 may be on the order of 10 kV, and the LEA sensed voltage output across the HV line electrode 130 and the voltage screen electrode 120 may be on the order of 1V. However, the ratio of the voltage measured across the HV line electrode 130 and the voltage screen electrode 120 and the voltage across the HV line electrode 130 and the ground 110 is not limited to this example.

In some embodiments, the floating reference voltage sensor system 100 is utilized to determine three phase high voltage line levels in a power distribution system. For example, a recloser system may include six such floating reference voltage sensor systems 100 including one for each of three HV line inputs to the recloser and three HV line outputs exiting from the recloser system. However, embodiments of the floating reference voltage sensor system 100 are not limited to applications in recloser controller systems and may be utilized in other HV analog systems.

Figure 2:
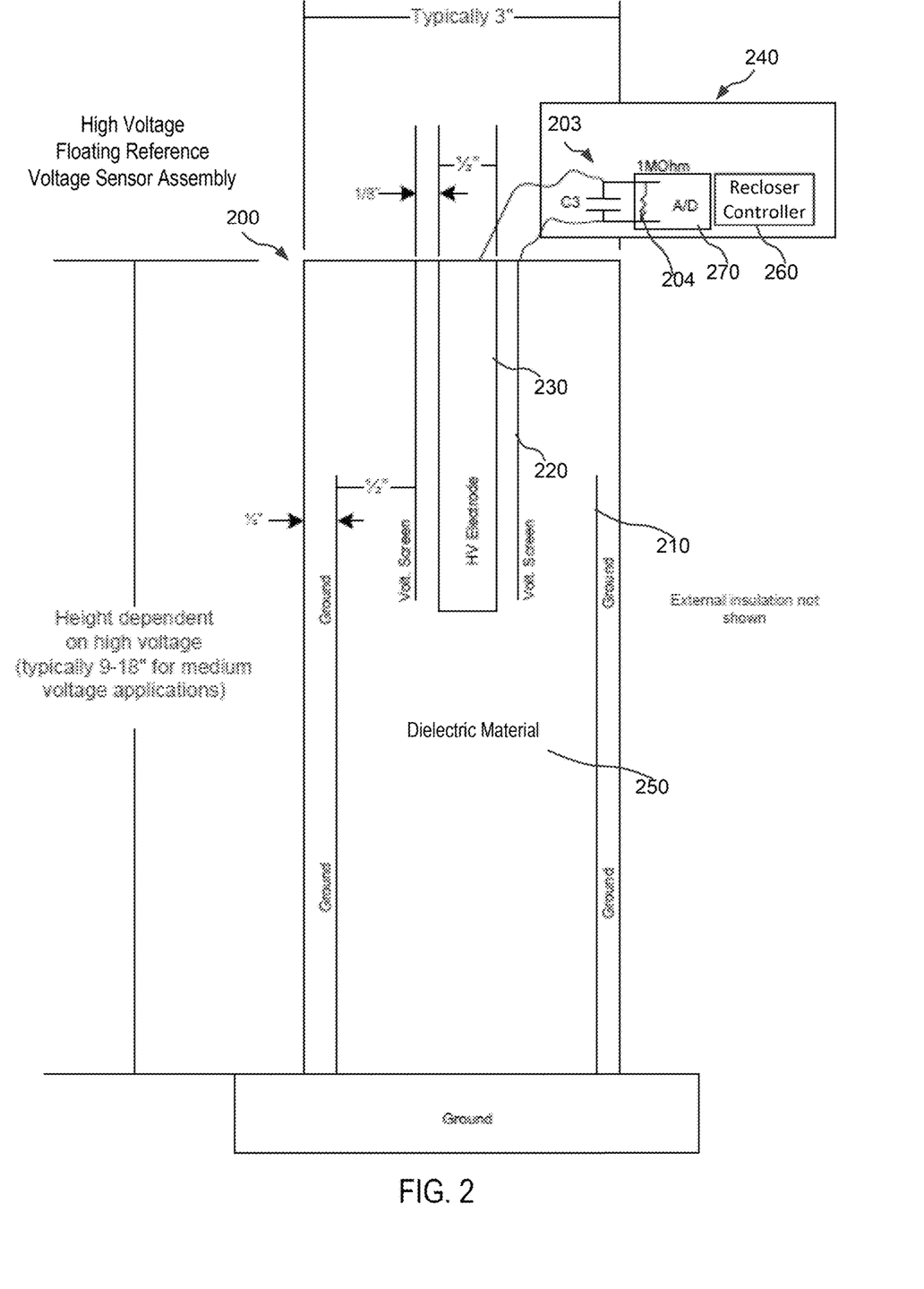
FIG. 2 is a diagram of a recloser switch controller and voltage sensor including a floating reference LEA voltage divider network, according to some embodiments.

FIG. 2 is a diagram of a recloser switch controller and voltage sensor including a floating reference LEA voltage divider network, according to some embodiments. Referring to FIG. 2, there is shown a voltage sensor assembly system 200. The example shown includes, among other things, a cylindrical ground plate 210, a cylindrical high energy transmission line electrode 230, a cylindrical voltage screen 220, and a dielectric material 250. The voltage sensor assembly system 200 may be enclosed in a molded insulating housing (not shown). External to the molded insulated housing are the components 240 that include a capacitor 203 (C3), a control resistor 204, a voltmeter 270, and a recloser controller 260.

The components in FIG. 2 correspond with the components represented in the circuit diagram of FIG. 1. The capacitor 101 represents the capacitance between the cylindrical high energy transmission line electrode 230 and the cylindrical voltage screen 220. The capacitor 102 represents the capacitance between the cylindrical voltage screen 220 and the cylindrical ground plate 210. The capacitor 103 represents the capacitor 203, and the control resistor 104 represents the control resistor 204. The voltage level of the cylindrical ground plate 210 is held at earth ground.

Although the voltage sensor assembly system 200 is shown as having the cylindrical ground plate 210, the cylindrical high energy transmission line electrode 230 and the cylindrical voltage screen 220, these elements are not necessarily cylindrical and may have a different geometry suitable to form a capacitive voltage divider network relative to the high energy transmission line electrode 230. The cylindrical voltage screen 220 may be referred to as the voltage screen 220 or the floating reference voltage screen 220, the cylindrical high energy transmission line electrode 230 may be referred to as the transmission line electrode 230, and the cylindrical ground plate 210 may be referred to as the ground plate 210.

The capacitor 203 is coupled in parallel with the capacitance between the transmission line electrode 230 and the cylindrical voltage screen 220. The capacitor 203 represents capacitance of passive components that are positioned between the voltage sensor assembly system 200 and the voltmeter 270, and are electrically coupled to the transmission line electrode 230 and the cylindrical voltage screen 220. For example, the capacitor 203 may comprise capacitance of electrical junctions in a junction box that is disposed between the voltage sensor assembly system 200 and both of the voltmeter 270 and recloser controller 260. The transmission line electrode 230 may carry a high energy alternating current.

The voltmeter 270 includes the control resistor 204 electrically coupled to both of the transmission line electrode 230 and the cylindrical voltage screen 220, in parallel with capacitor 203. The voltmeter 270 measures the low energy voltage across the control resistor 204 and converts the voltage level to a digital value, which may be read by the recloser controller 260. The voltmeter 270 and the recloser controller 260 are not connected to the cylindrical ground plate 210 and are not connected to earth ground (ungrounded). Instead, the voltmeter 270 and the recloser controller 260 are referenced to floating voltage levels of the transmission line electrode 230 and the cylindrical voltage screen 220.

In the embodiment shown, the cylindrical voltage screen 220 concentrically encircles the transmission line electrode 230. The cylindrical ground plate 210 concentrically encircles the cylindrical voltage screen 220, and thus, also concentrically encircles the transmission line electrode 230. Moreover, the cylindrical voltage screen 220 is positioned closer to the transmission line electrode 230 than to the cylindrical ground plate 210. Leads from the cylindrical voltage screen 220 and the transmission line electrode 230 are electrically coupled to inputs of the voltmeter 270. A first capacitance exists between the transmission line electrode 230 and the cylindrical voltage screen 220 that corresponds to the capacitor 101 of the voltage divider network of FIG. 1. A second capacitance exists between the cylindrical voltage screen 220 and the cylindrical ground plate 210 that corresponds to the capacitor 102 of the voltage divider network of FIG. 1. Open internal volumes of the voltage sensor assembly 200 may be filled with the dielectric material 250, for example, a solid dielectric material. The example shown in FIG. 2 forms a voltage divider network that is represented by the voltage divider network diagram shown in FIG. 1. The capacitance that is characteristic of the transmission line electrode 230 encircled by cylindrical voltage screen 220 with intervening dielectric material 250 is connected in parallel with the capacitor 203 and the controller resistor 204. All of these components are connected in series with the capacitance that is characteristic of the cylindrical ground plate 210 encircling the cylindrical ground plate 210 with intervening dielectric material 250. A processor in the recloser controller 260 determines a drop in voltage from the transmission line electrode 230 to the cylindrical ground plate 210 (or earth ground) based on the low energy voltage read from the voltmeter 270, and impedance values of the voltage divider network that are developed due to the passive components of the voltage divider network described with respect to FIGS. 1 and 2.

The cylindrical voltage screen 220 is positioned closer to the transmission line electrode 230 than to the cylindrical ground plate 210. The voltages measured across the control resistor 204 include low energy voltages that may be an order of magnitude smaller or multiple orders of magnitude smaller than voltages developed across the cylindrical voltage screen 220 and the cylindrical ground plate 210. FIG. 2 includes an example of linear dimensions for a recloser voltage sensor assembly 200. However, these specific linear dimensions are included to provide an example. In other embodiments, the dimensions may be different. In addition, although the voltage sensor assembly system 200 shown in FIG. 2 comprises a voltage screen and a ground plate forming concentric cylinders about the transmission line electrode 230, other configurations may be used. The capacitances that correspond to capacitor 101 and capacitor 102 of the voltage divider network of FIG. 1 could also be created by plates, rods, spheres, or other shapes, placed near each other with the dielectric material 250 between them. The dimensions and placement of the shapes inside the dielectric material also has almost limitless configurations, depending on the intended power system voltage, dielectric material used, and capabilities of the voltmeter 270.

Figure 3:
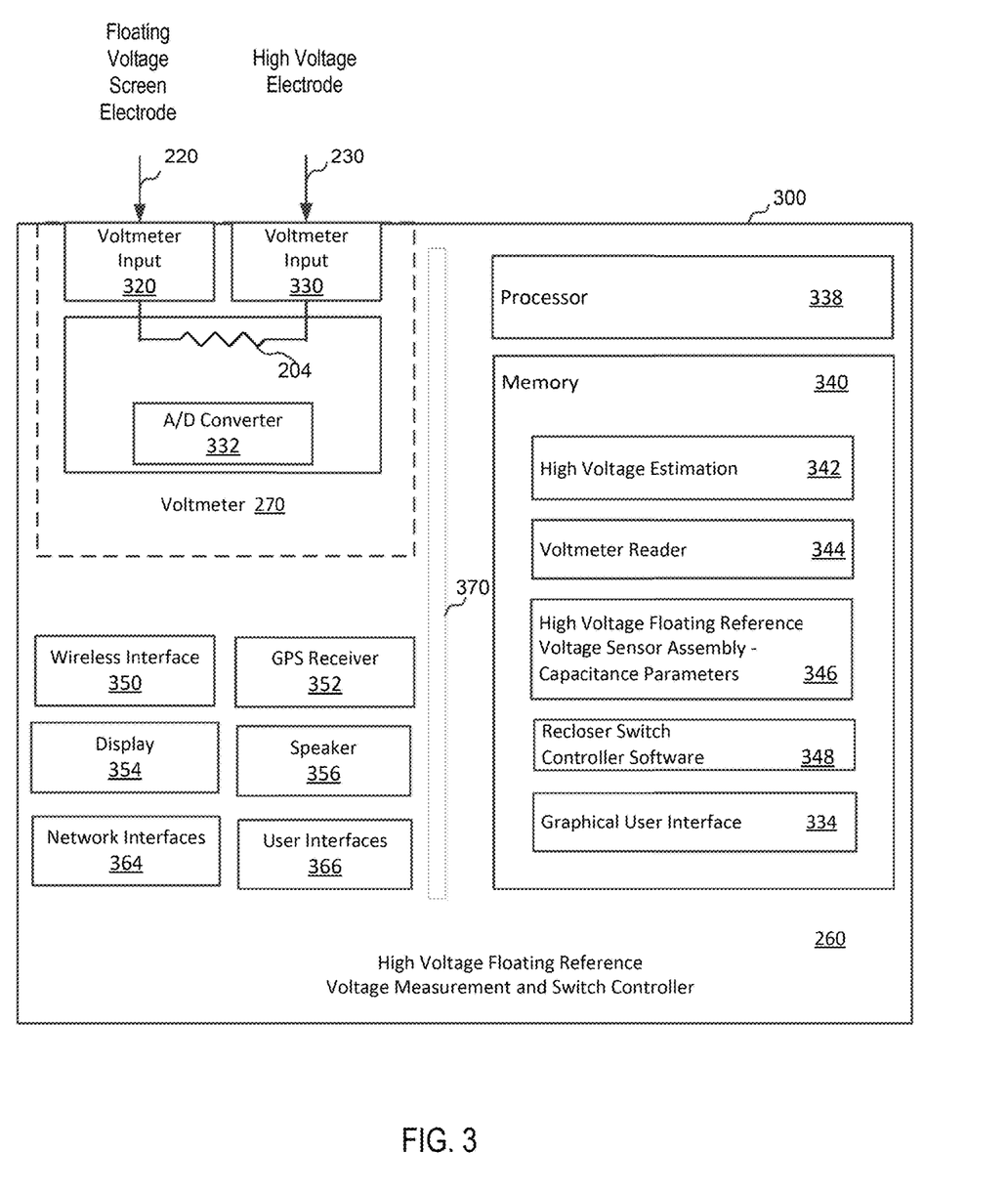
FIG. 3 is a block diagram of a recloser controller system that determines voltage levels of a high power transmission line utilizing a floating reference LEA voltage divider network, according to some embodiments.

FIG. 3 is a block diagram of a recloser controller system that determines voltage levels of a high power transmission line utilizing a floating reference LEA voltage divider network, according to some embodiments. A recloser controller and voltage measurement system 300 includes the recloser controller 260 and the voltmeter 270. The voltmeter 270 includes, among other things, the control resistor 204, an analog to digital (A/D) converter 332, and voltmeter inputs 320 and 330 that are electrically coupled to leads of the voltage screen 220 and the transmission line electrode 230. However, although the control resistor 104 is shown and referred to as a resistor, the control resistor 104 may comprise or represent an impedance component, for example, a capacitor and/or an inductor. The recloser controller 260 includes, among other things, a processor 338, a memory 340, a graphical user interface 334, an interface 370, a wireless interface 350, a global positioning satellite (GPS) receiver 352, a display 354, a speaker 356, network interfaces 364, and a user interfaces 366. The voltmeter 270 and the recloser controller 260 are not connected to ground.

The memory 340 may store program instructions 342 for estimating alternating current (AC) voltage across the transmission line electrode 230 to the ground plate 210 based on measurements from the floating reference voltage divider circuit taken from the transmission line electrode 230 to the voltage screen 220, described with respect to FIGS. 1 and 2. The memory 340 may store low voltage voltmeter readings from the A/D converter 332 and/or high voltage estimations 344.

Memory 346 may store configuration parameters for passive components of the voltage sensor assembly system 200 floating reference voltage divider network and passive components of the external components 240, including parameters for the capacitance between the transmission line electrode 230 and the voltage screen 220, the capacitance between the voltage screen 220 and the ground plate 210, the capacitor 203 and the control resistor 204. Program instructions 348 for recloser switch and recloser controller systems operations may be stored in the memory 340. The configuration parameters and program instructions may be utilized to compensate or calibrate for any inaccuracies of the magnitude or phase of a voltage reading.

Various configurations of the elements of the recloser controller and voltage measurement system 300 may be implemented. For example, the voltmeter 270 may be located outside of the recloser and electrically coupled to the recloser controller 260, or it may be integrated with the recloser controller 260 in a single housing. In some embodiments, the voltmeter 270 and recloser controller 260 may be positioned near to a recloser switch in a junction box or some location that is more accessible by a user. The distance between the recloser switch and the voltmeter 270 and recloser controller 260 is not critical for the performance of the sensor, and it is typically limited by other components for the recloser's operation Embodiments of the disclosure as described herein, for example, embodiments directed to a low energy analog voltage sensor comprising a floating reference voltage divider network and determining high energy analog transmission line electrode voltages relative to ground may be executed on one or more ungrounded computer systems, ungrounded electronic processors, or ungrounded controllers that may interact with various other devices. One such recloser computer system is illustrated by FIG. 3 as the recloser controller and voltage measurement system 300, which may be referred to as the computer system 300. The computer system 300 may include any of various types of devices, including, but not limited to, a programmable electronic processor, for example, a microprocessor, an ASIC, a mobile computing device, a personal computer system, desktop computer, laptop, notebook, or netbook computer, mainframe computer system, mobile telephone, workstation, network computer, various peripheral devices, or another type of computing or electronic device.

In the illustrated embodiment, computer system 300 includes one or more processors 338 coupled to the memory 340. Computer system 300 further includes a network interface 364 coupled to interface 370, and one or more user input/output devices 366, such as cursor control device, keyboard, and a display(s). In some embodiments, it is contemplated that embodiments may be implemented using a single instance of computer system 300, while in other embodiments multiple such systems, or multiple nodes making up computer system 300, may be configured to host different portions or instances of embodiments. For example, in one embodiment some elements may be implemented via one or more nodes of computer system 300 that are distinct from those nodes implementing other elements.

The memory 340 may be configured to store program instructions and/or data accessible by processor 338. In various embodiments, the memory 340 may be implemented using suitable memory technology, such as static random access memory (SRAM), synchronous dynamic RAM (SDRAM), nonvolatile/Flash-type memory, or another type of memory. In the illustrated embodiment, program instructions and data implementing desired functions, such as those described above for various embodiments, are stored within the memory 340 as recloser switch controller program instructions 348, high voltage estimation instructions 342, and data storage 344 and 346. In other embodiments, program instructions and/or data may be received, sent or stored upon different types of computer-accessible media or on similar media separate from the memory 340 or computer system 300. Moreover, in some embodiments, a database (not shown) accessible via the network interface 364 may store, among other things, floating reference voltage divider parameters, LEA measurement values, determined high energy line voltages, voltage estimation instructions, and voltmeter parameters. Generally speaking, a computer-accessible medium may include storage media or memory media such as magnetic or optical media, e.g., a flash memory card, a disk, or CD/DVD-ROM coupled to computer system 300 via interface 370.

In one embodiment, interface 370 may be configured to coordinate I/O traffic between processor 338, the memory 340, and any peripheral devices, including via the network interfaces 364 or other peripheral interfaces, such as input/output devices 366 or display 354. In some embodiments, interface 370 may perform any necessary protocol, timing or other data transformations to convert data signals from one component (e.g., the memory 340) into a format suitable for use by another component (e.g., processor 338). In some embodiments, interface 370 may include support for devices attached through various types of peripheral buses, such as a variant of the Peripheral Component Interconnect (PCI) bus standard or the Universal Serial Bus (USB) standard, for example. In some embodiments, the function of interface 370 may be split into two or more separate components, such as a north bridge and a south bridge, for example. In addition, in some embodiments some or all of the functionality of interface 370, such as an interface to the memory 340, may be incorporated directly into processor 338.

Network interfaces 364 may be configured to allow data to be exchanged between computer system 300 and other devices attached to a network, such as other computer systems, a database, or between nodes of computer system 300. In various embodiments, network interface 364 may support communication via wired or wireless general data networks, such as any suitable type of Ethernet network, for example; via telecommunications/telephony networks such as analog voice networks or digital fiber communications networks; via storage area networks such as Fiber Channel SANs, or via any other suitable type of network and/or protocol. In some embodiments, the processor 338 may communicate voltage levels determined by the voltmeter 270 or the high-voltage estimation module program instructions 342 to remote computer systems via the network interfaces 364 or the wireless interface 350, for example, via a cellular network. The communications may include location information for the recloser controller 260 or the coupled recloser switch based on location information determined by the GPS receiver 352. Furthermore, the low energy or high energy voltage levels, the location information, and/or various information about an attached recloser system may be displayed via the graphical user interface 334 and/or the display 354. The user interfaces 366 may receive user commands or configuration information for the recloser controller 260 and/or the voltmeter 270.

Input/output devices connected via the user interfaces 366 may, in some embodiments, include one or more display terminals, keyboards, keypads, touchpads, scanning devices, voice or optical recognition devices, or any other devices suitable for entering or retrieving data by one or more computer system 300. Multiple input/output devices may be present in computer system 300 or may be distributed on various nodes of computer system 300. In some embodiments, similar input/output devices may be separate from computer system 300 and may interact with one or more nodes of computer system 300 through a wired or wireless connection, such as over network interface 364.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system 300 via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 300 may be transmitted to computer system 300 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Accordingly, the present embodiments may be practiced with other computer system configurations.

Figure 4:
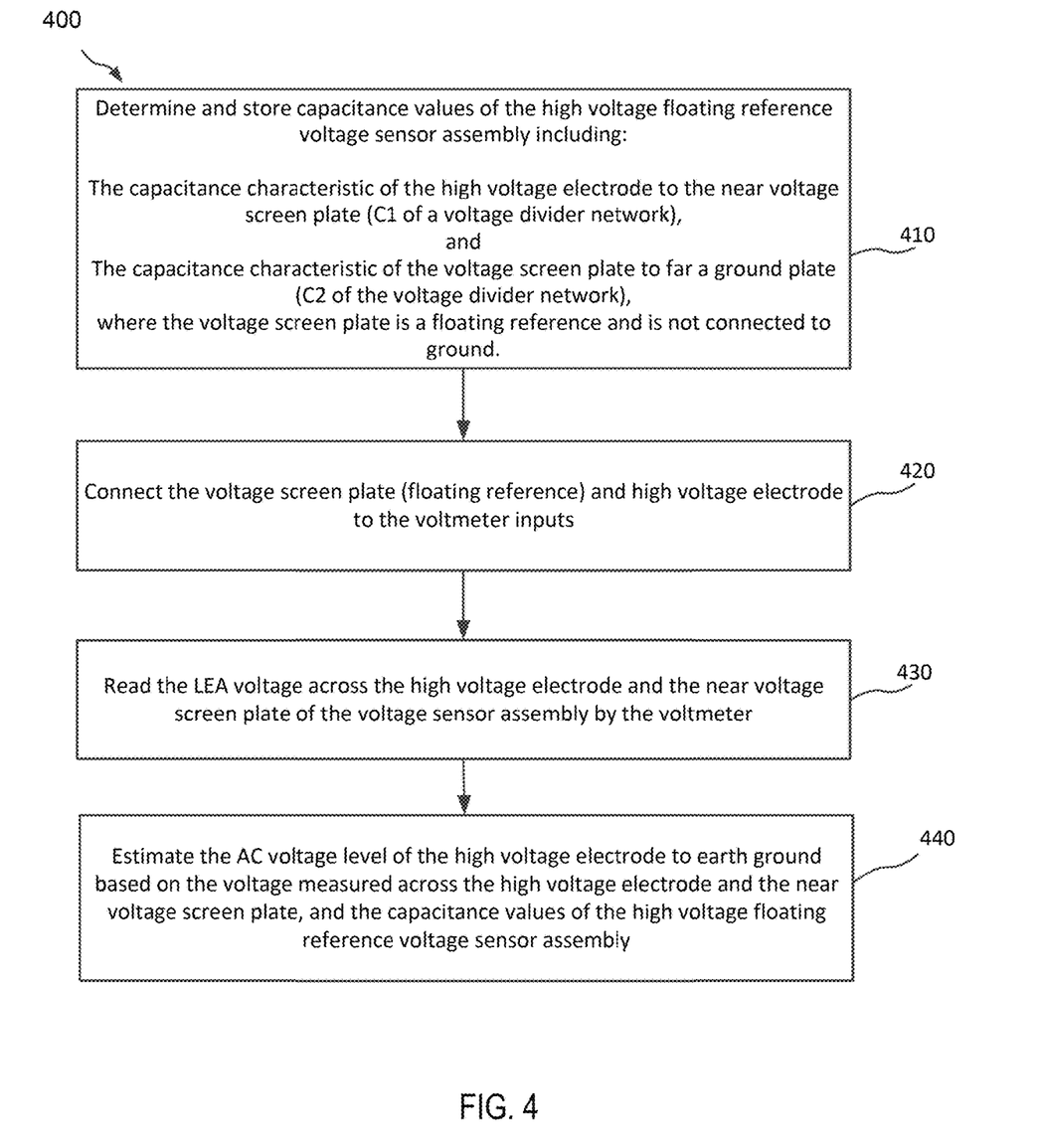
FIG. 4 is a flow chart of a method for taking LEA voltage measurements with a floating reference voltage divider network and determining voltage of a high power transmission line relative to ground, according to some embodiments.

FIG. 4 is a flow chart of a method for taking LEA voltage measurements with a floating reference voltage divider network and determining voltage of a high power transmission line relative to ground, according to some embodiments.

In step 410, floating reference LEA voltage sensor and measurement parameters may be stored in the memory 346. For example, the capacitance between the transmission line electrode 230 and the voltage screen 220, the capacitance between the voltage screen 220 and the ground plate 210, the capacitor 203 and the control resistor 204 may be stored in the memory 346. In other embodiments, the values for the capacitor 101, the capacitor 102, the capacitor 103, and the control resistor 104 may be stored in the memory 346.

In step 420, leads from the transmission line electrode 230 and the voltage screen 220 are electrically coupled to the voltmeter inputs 320 and 330, without connecting the voltmeter 270 or the recloser controller 260 to the ground plate 210 or earth ground. The capacitance between the transmission line electrode 230 and the voltage screen 220 is connected in parallel with the capacitor 203 and the control resistor 204.

In step 430, the voltage is measured across the electrode 230 and voltage screen 220 and is converted to digital values by the A/D converter 332.

In step 440, voltage levels are estimated for the voltage drop from the transmission line electrode 230 to the ground plate 210 that is held at earth ground. The recloser controller 260 reads the A/D converted voltmeter 270 output. The voltage levels from ground plate 210 to the transmission line electrode 230 are determined based on the low energy measurements and the parameters stored in memory 346 including the capacitance between the transmission line electrode 230 and the voltage screen 220, the capacitance between the voltage screen 220 and the ground plate 210, the capacitor 203, and the control resistor 204. In other embodiments, the values for the capacitor 101, the capacitor 102, the capacitor 103, and the control resistor 104 are used in the earth ground to high AC voltage estimation.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Various modifications and changes may be made as would be obvious to a person skilled in the art having the benefit of this disclosure. It is intended that the present embodiments embrace all such modifications and changes and, accordingly, the above description to be regarded in an illustrative rather than a restrictive sense.

Thus, the embodiments provide, among other things, systems and methods for dynamically configuring display of a plurality of documents based on a document review task associated with the plurality of documents. Various features and advantages are set forth in the following claims.

I claim:

1. A floating reference recloser voltage sensor system for measuring low energy voltage in a high energy transmission line electrode divider network, the system comprising:
   a high energy transmission line electrode;
   a floating reference voltage screen encircling the high energy transmission line electrode;
   a ground plate encircling the floating reference voltage screen and the high energy transmission line electrode;
   wherein the floating reference voltage screen is positioned between the high energy transmission line electrode and the ground plate at a distance from the high energy transmission line electrode that is shorter than a distance between the ground plate and the floating reference voltage screen; and
   a first conductive lead electrically coupling the high energy transmission line electrode to a first input of a voltmeter connected to a recloser controller and a second conductive lead electrically coupling the floating reference voltage screen to a second input of the voltmeter connected to the recloser controller for measuring an alternating voltage drop across the high energy transmission line electrode and the floating reference voltage screen by electronics of the voltmeter connected to the recloser controller;
   wherein the recloser controller and the voltmeter are both disconnected from the ground plate.

2. The system of claim 1 wherein the floating reference voltage screen encircling the high energy transmission line electrode and the ground plate encircling the floating reference voltage screen form a voltage divider network for the measuring of the alternating voltage drop when the first conductive lead is connected with the first input of the voltmeter and the second conductive lead is connected with the second input of the voltmeter and a capacitor is connected in parallel with the first conductive lead and the second conductive lead.

3. The system of claim 1 wherein the high energy transmission line electrode, the floating reference voltage screen encircling the high energy transmission line electrode and the ground plate encircling the floating reference voltage screen and the high energy transmission line electrode are enclosed in a housing, and the open internal volumes within the housing are filled with a dielectric material.

4. The system of claim 1 wherein the alternating voltage drop across the high energy transmission line electrode and the floating reference voltage screen is smaller than a voltage drop between the floating reference voltage screen and the ground plate.

5. The system of claim 1 wherein the voltmeter connected to the recloser controller comprises an analog to digital converter, and the recloser controller reads a voltage drop value output from the analog to digital converter that represents the voltage drop across the high energy transmission line electrode and the floating reference voltage screen.

6. The system of claim 5 wherein the recloser controller determines a voltage drop across the high energy transmission line electrode and the ground plate based on the voltage drop value output from the analog to digital converter and a capacitance electrically coupled between the high energy transmission line electrode and the floating reference voltage screen, and a capacitance electrically coupled between the floating reference voltage screen and the ground plate.

7. The system of claim 1 wherein the floating reference voltage screen is a cylindrical voltage screen, the ground plate is a cylindrical ground plate, and the ground plate is electrically coupled to earth ground.

8. A method for measuring low energy voltage in a high energy transmission line electrode sensor network, the method comprising:
   concentrically encircling a floating reference voltage screen about a high energy transmission line electrode;
   concentrically encircling a ground plate about the floating reference voltage screen and the high energy transmission line electrode, wherein the floating reference voltage screen is positioned between the high energy transmission line electrode and the ground plate at a distance from the high energy transmission line electrode that is shorter than a distance between the ground plate and the floating reference voltage screen; and
   electrically coupling a first conductive lead to the high energy transmission line electrode and to a first input of a voltmeter connected to a recloser controller;
   electrically coupling a second conductive lead to the floating reference voltage screen and to a second input of the voltmeter connected to the recloser controller; and
   measuring a voltage drop across the high energy transmission line electrode and the floating reference voltage screen by electronics of the voltmeter connected to the recloser controller;

wherein the recloser controller and the voltmeter are both disconnected from the ground plate.

9. The method of claim 8 wherein the floating reference voltage screen encircling the high energy transmission line electrode and the ground plate encircling the floating reference voltage screen form a voltage divider network for the measuring of the voltage drop when the first conductive lead is connected with the first input of the voltmeter and the second conductive lead is connected with the second input of the voltmeter and a capacitor is connected in parallel with the first conductive lead and the second conductive lead.

10. The method of claim 8 wherein the high energy transmission line electrode, the floating reference voltage screen concentrically encircling the high energy transmission line electrode and the ground plate concentrically encircling the floating reference voltage screen and the high energy transmission line electrode are enclosed in a housing, and the open internal volumes within the housing are filled with a solid dielectric material.

11. The method of claim 8 wherein the voltage drop across the high energy transmission line electrode and the floating reference voltage screen is smaller than a voltage drop between the floating reference voltage screen and the ground plate.

12. The method of claim 8 wherein the voltmeter connected to the recloser controller comprises an analog to digital converter, and the recloser controller reads a voltage drop value output from the analog to digital converter that represents the voltage drop across the high energy transmission line electrode and the floating reference voltage screen.

13. The method of claim 12 wherein the recloser controller determines a voltage drop across the high energy transmission line electrode and the ground plate based on the voltage drop value output from the analog to digital converter and a capacitance electrically coupled between the high energy transmission line electrode and the floating reference voltage screen, and a capacitance electrically coupled between the floating reference voltage screen and the ground plate.

14. The method of claim 8 wherein the floating reference voltage screen is a cylindrical voltage screen, the ground plate is a cylindrical ground plate, and the ground plate is electrically coupled to earth ground.

15. A system for determining high energy transmission line electrode voltages based on a floating reference in a low energy voltage sensor network, the system comprising:
a recloser controller comprising a memory and an electronic processor, and
a voltmeter electrically coupled to the recloser controller and electrically coupled to leads of a high energy transmission line electrode and a floating reference voltage screen concentrically encircling the high energy transmission line electrode, wherein the floating reference voltage screen is positioned closer to the high energy transmission line electrode than to a ground plate concentrically encircling both of the high energy transmission line electrode and the floating reference voltage screen, wherein the voltmeter and the recloser controller are disconnected from the ground plate;
an analog to digital converter for converting low energy voltage measurements of a voltage drop between the high energy transmission line electrode and the floating reference voltage screen for use by the electronic processor;

the memory storing:
capacitance level parameters for a capacitor formed by the high energy transmission line electrode and the floating reference voltage screen and intervening dielectric material;
capacitance level parameters for a capacitor formed by the floating reference voltage screen and the ground plate and intervening dielectric material;
system capacitance and resistance values for components connected in parallel with the capacitor formed by the high energy transmission line electrode and the floating reference voltage screen; and
instructions stored in the memory that when executed by the electronic processor cause the electronic processor to:
read a voltage level output from the analog to digital converter of the voltage drop between the high energy transmission line electrode and the floating reference voltage screen; and
determine a voltage level for a voltage drop between the high energy transmission line electrode and the ground plate based on:
the capacitance level parameters for the capacitor formed by the high energy transmission line electrode and the floating reference voltage screen stored in the memory;
the capacitance level parameters for the capacitor formed by the floating reference voltage screen and the ground plate stored in the memory; and
the system capacitance and resistance values for the components connected in parallel with the capacitor formed by the high energy transmission line electrode and the floating reference voltage screen.

16. The system of claim 15 further comprising a wireless interface, wherein the voltage level for the voltage drop between the high energy transmission line electrode and the ground plate is transmitted to a remote computer system via a cellular network.

17. The system of claim 15 wherein the floating reference voltage screen encircling the high energy transmission line electrode and the ground plate encircling the floating reference voltage screen form a voltage divider network for measuring the low energy voltage measurements when the floating reference voltage screen and the high energy transmission line electrode are connected in parallel with the voltmeter and a system capacitance.

18. The system of claim 15 wherein the high energy transmission line electrode, the floating reference voltage screen concentrically encircling the high energy transmission line electrode, and the ground plate concentrically encircling the floating reference voltage screen and the high energy transmission line electrode are enclosed in a housing, and the open internal volumes within the housing are filled with a solid dielectric material.

19. The system of claim 15 wherein a voltage drop across the high energy transmission line electrode and the floating reference voltage screen is smaller than a voltage drop between the floating reference voltage screen and the ground plate.

20. The system of claim 15 wherein the floating reference voltage screen is a cylindrical voltage screen, the ground plate is a cylindrical ground plate, and the ground plate is electrically coupled to earth ground.

* * * * *